United States Patent [19]
Fleischer et al.

[11] 3,792,367
[45] Feb. 12, 1974

[54] ACTIVE CONTROLLABLE FILTER CIRCUIT USING VARIABLE TRANSCONDUCTANCE AMPLIFIER

[75] Inventors: Paul Egon Fleischer, Little Silver; Dan Hilberman, Middletown, both of N.J.

[73] Assignee: Bell Telephone Laboratories Incorporated, Murray Hill, Berkeley Heights, N.J.

[22] Filed: May 1, 1972

[21] Appl. No.: 249,090

[52] U.S. Cl. .................................... 330/98, 330/69
[51] Int. Cl. ............................................ H03f 1/24
[58] Field of Search ..... 330/30 D, 107, 98, 109, 85; 333/28 R, 75; 328/167

[56] References Cited

UNITED STATES PATENTS

| | | | |
|---|---|---|---|
| 3,701,034 | 10/1972 | Bruene | 330/107 X |
| 2,242,878 | 5/1941 | Bode | 330/98 X |
| 2,367,711 | 1/1945 | Bode | 330/98 X |
| 3,621,226 | 11/1971 | Wittlinger | 330/30 D X |

OTHER PUBLICATIONS

Design of Active Filters–Using Operational Amplifiers–Muir & Robinson–"Systems Technology" – April, 1968– pp. 18–30.

*Primary Examiner*—Nathan Kaufman
*Attorney, Agent, or Firm*—G. E. Murphy

[57] ABSTRACT

An RC active filter circuit wherein the active elements of the circuit are realized by controllable transconductance amplifiers. The transfer response of the filter circuit is readily variable by altering signals applied to the control terminals of the transconductance amplifiers.

6 Claims, 9 Drawing Figures

ACTIVE CONTROLLABLE FILTER CIRCUIT USING VARIABLE TRANSCONDUCTANCE AMPLIFIER

BACKGROUND OF THE INVENTION

This invention pertains to signal transmission networks and, more particularly, to active resistance-capacitance (RC) filter circuits.

Networks that do not use inductors, i.e., inductorless networks, have become increasingly important with the development and implementation of integrated circuit technology. Since inductors are not conveniently realized in integrated circuit configurations, the advantages of integrated circuit technology may generally only be applied to those circuits which do not include inductors. It is generally well known that a wide variety of network transfer responses, obtained from conventional passive circuits which do use inductors, may also be obtained from RC active networks which utilize only resistors, capacitors, and active elements, e.g., amplifiers.

One of the advantages of active RC filter circuits is that they may have their transmission characteristics readily varied. Such networks are therefore of use in applications requiring variable transmission responses. A particular RC network, of great interest to those skilled in the art, is a network exhibiting a general biquadratic transfer response. See, for example, the discussion in "Active Filters: New Tools for Separating Frequencies" by L. C. Thomas in Bell Laboratories Record, Vol. 49, No. 4, Apr. 1971, pp. 121–125.

Numerous circuits have been proposed for altering the transfer characteristics of an active filter circuit by varying the value of resistors and capacitors used in the circuit. See, for example, the circuits disclosed in the copending U.S. patent applications of P. E. Fleischer, Ser. No. 167,242, filed July 29, 1971, U.S. Pat. No. 3,715,680, issued Feb. 6, 1973; P. E. Fleischer, Ser. No. 167,241, filed July 29, 1971, U.S. Pat. No. 3,715,679, issued Feb. 6, 1973; and C. A. Harris, Ser. No. 172,717, filed Aug. 18, 1971, Case 1. Though such networks perform satisfactorily, it is still a difficult endeavor to readily alter resistors and capacitors with the precision that is many times desired in filter circuits.

Accordingly, it is an object of this invention to realize active RC filter circuits, the transfer characteristics of which are readily alterable.

SUMMARY OF THE INVENTION

These and other objects of this invention are accomplished, in accordance with the principles of this invention, by utilizing a filter circuit which incorporates a plurality of variable transconductance amplifiers. More particularly, two or more transconductance amplifiers are cascaded and interconnected by a feedback loop; resistors and capacitors are selectively coupled to the input and output of the various amplifiers to provide the desired overall transfer characteristic. By selectively altering control signals supplied to the transconductance amplifiers, the overall transfer characteristic of the amplifier may be changed. In another embodiment of this invention, the transfer characteristic is altered by applying a plurality of diverse input signals to various components of the filter circuit. Thus, by the practice of this invention, a variable filter is realized which is capable of being used as a sweeping bandpass filter, as an adjustable allpass (delay) section, or as a stable filter whose characteristics may be changed to compensate for temperature or time induced variations in performance.

Further features and objects of this invention, its nature and various advantages, will be more apparent upon consideration of the attached drawing and the following detailed description.

DETAILED DESCRIPTION OF THE INVENTION

Figure 1:
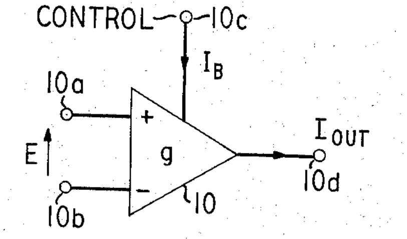
FIG. 1 is a schematic representation of a variable transconductance amplifier.
Figure 2:
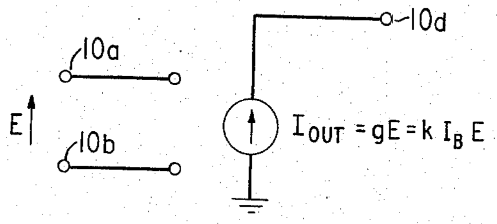
FIG. 2 is an equivalent circuit diagram of the variable transconductance amplifier of FIG. 1.

FIG. 1 illustrates schematically a transconductance amplifier 10, identified by a symbol *g* rather than the conventional amplifier symbol A, used in the practice of the present invention. As illustrated by the equivalent circuit of FIG. 2, the transconductance amplifier of FIG. 1 develops a current signal output, $I_{OUT}$, which is linearly proportional to an applied input voltage signal, E. The coefficient of proportionality, $g$, is a function of a bias control current, $I_B$, applied to the amplifier. Because of the indicated relationship of output current to input voltage, the use of the term "transconductance" is appropriately borrowed from vacuum tube device terminology. Generally characterizing such amplifiers, it may be said that each amplifier has a pair of differential input terminals, 10*a*, 10*b*; each amplifier has a bias current control terminal, 10*c*, for the application thereto of an external bias current, $I_B$, which determines the conductivity level and thereby the transconductance, $g$, of the amplifier; each amplifier has an output terminal, 10*d*, for producing an output current signal, $I_{OUT}$, which is proportional to the product of the transconductance, $g$, of the amplifier and the differential signal input, E; and each amplifier is characterized by an extremely high input and output impedance. A more detailed discussion of such amplifiers may be found in U.S. Pat. No. 3,621,226 issued to H. A. Wittlinger on Nov. 16, 1971. As discussed by Wittlinger, typical values for the variable transconductance $g$, are given by $g = 2I_B$, where $g$ is in mohs and $I_B$, in $mA$, is limited to the current carrying capacity of an emitter of a transistor internal to the amplifier. Considering typical values for $I_B$ the transconductance values are generally well below 100 mohs.

Figure 3:
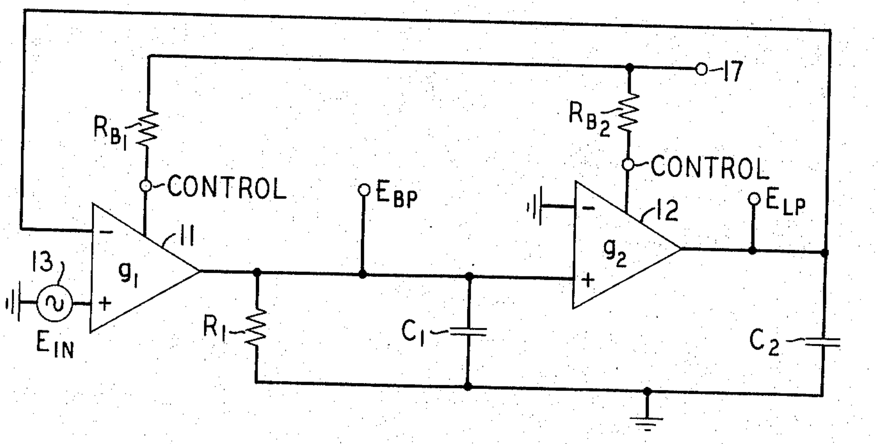
FIG. 3 is a filter circuit, in accordance with the principles of this invention, which utilizes two variable transconductance amplifiers.

FIG. 3 depicts an active filter network circuit utilizing transconductance amplifiers in accordance with this invention. As indicated, transconductance amplifiers 11 and 12, respectively, are characterized by transconductances identified as $g_1$ and $g_2$. An input signal, $E_{IN}$, supplied by source 13, is applied to one of the input terminals of amplifier 11. The output signal of amplifier 11 is applied to one of the input terminals of amplifier 12. Resistor $R_1$ and capacitor $C_1$ are connected to a terminal of fixed potential, e.g., ground, and to a common connection of the output of amplifier 11 and an input of amplifier 12. The output of amplifier 12 is returned to the unused input terminal of amplifier 11. Capacitor $C_2$ is connected between the output terminal of amplifier 12 and ground. A bandpass filter signal response is available at the terminal identified as $E_{BP}$ and a low-pass filter signal response is available at the terminal identified as $E_{LP}$. In order to vary the transfer response of the filter, a control signal may be applied to amplifiers 11 and 12 via terminal 17 and resistors $R_{B_1}$ and $R_{B_2}$, respectively, to alter the bias current of the amplifiers. It may be readily shown that the bandpass transfer response is $$(E_{BP}/E_{IN}) = [(g_1/C_1)\ s/s^2 + (1/R_1C_1)\ s + (g_1g_2/C_1C_2)], \quad (1)$$

and that the low-pass transfer response is $$(E_{LP}/E_{IN}) = [(g_1g_2/C_1C_2)/s^2 + (1/R_1C_1)\ s + (g_1g_2/C_1C_2)]. \quad (2)$$

Thus, in accordance with the principles of this invention, by varying the transconductance parameters, $g_1$ and $g_2$, while maintaining the magnitude of $g_1g_2/C_1C_2$ commensurate with the other terms in the denominator of equation 2 the transfer characteristic of the filter network is altered. More specifically, the factor $g_1g_2/C_1C_2$ controls the frequency location of the poles of equation 2. This factor, unlike comparable factors used in the cited prior art, contains no resistive terms. Control over the transconductance parameters may be accomplished by a d.c. control voltage, applied to control voltage terminal 17, which, e.g., sweeps or steps the bandpass filter center frequency, a function of $g_1g_2$, over a range of frequencies while the bandwidth is maintained constant.

Figure 4:
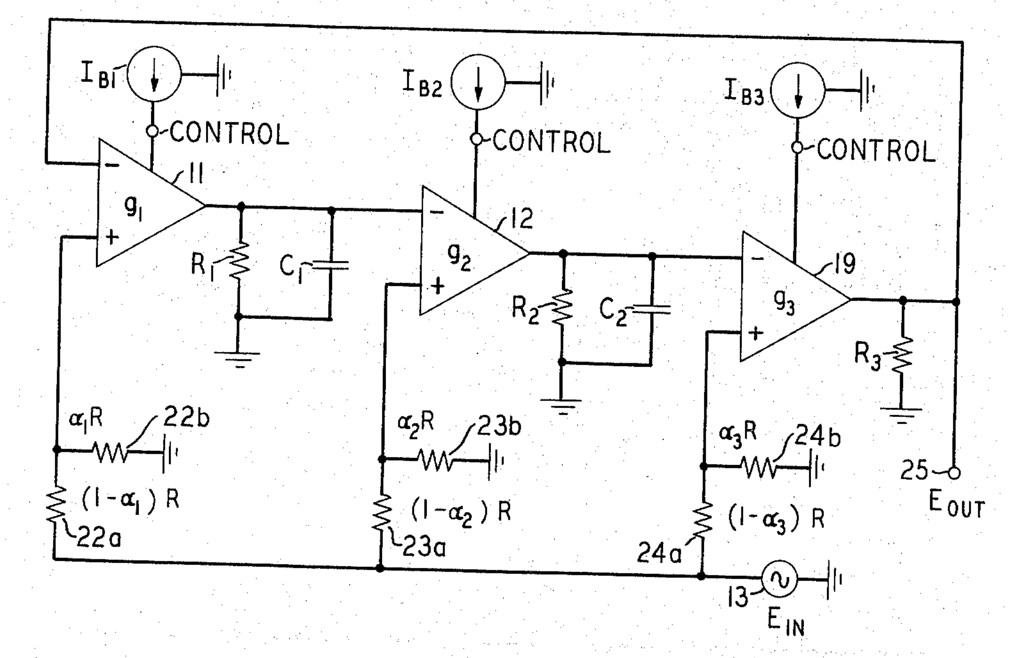
FIG. 4 is a filter circuit, in accordance with the principles of this invention, which utilizes three variable transconductance amplifiers and provides a transfer response which is a general biquadratic function.

A more general biquadratic filter transfer response is provided by the filter circuit of FIG. 4 wherein not only are complex poles present in the transfer response, but so also are complex zeros. Components identical to those of FIG. 3 have been identically identified. Thus, as indicated in FIG. 4, three transconductance amplifiers 11, 12 and 19 are connected in tandem, the output of one amplifier feeding one of the input terminals of another amplifier. A feedback path is connected between output terminal 25 of amplifier 19 and one of the input terminals of amplifier 11. A first resistor-capacitor network, $R_1$, $C_1$, is connected between the output terminal of amplifier 11 and a terminal of fixed potential, e.g., ground, and a second resistor-capacitor network, $R_2$, $C_2$, is connected between the output terminal of amplifier 12 and ground. Resistor $R_3$ is connected between the output terminal of amplifier 19 and ground to provide a fixed gain. The input signal, $E_{IN}$, supplied by source 13, is applied to the input terminals of amplifiers 11, 12 and 19 via voltage divider networks 22, 23, and 24. Control of the transconductance characteristic of the amplifiers is accomplished by bias current sources $I_{B_1}$, $I_{B_2}$, and $I_{B_3}$. Of course, a voltage source and resistor network may also be used similar to that depicted in FIG. 3. Generally, resistor $R_1$ is not required in this circuit. With resistor $R_1$ removed, the transfer response of the circuit of FIG. 4 is $$T(s) = \frac{E_{OUT}}{E_{IN}} = \frac{\alpha_3 g_3 R_3\left[s^2 + \left(\frac{G_2}{C_2} - \frac{g_2\alpha_2}{C_2\alpha_3}\right)s + \frac{g_1g_2\alpha_1}{C_1C_2\alpha_3}\right]}{s^2 + \frac{G_2}{C_2}s + \frac{R_3g_1g_2g_3}{C_1C_2}} \quad (3a)$$

or, more generally, $$T(s) = (n_2s^2 + n_1s + n_0/d_2s^2 + d_1s + d_0), \quad (3b)$$

which is a general biquadratic function. Here, the pole frequency location and the zero frequency location are directly controlled by the magnitude of the term $g_1g_2/C_1C_2$ without interaction of any respective components (other than the $\alpha_1/\alpha_3$ term and the fixed gain term $R_3g_3$). If both $n_2$ and $d_2$ are nonzero this can be rewritten as $$T(s) = K\ [s^2 + \omega_Z/q_Z)\ s + \omega_Z^2/s^2 + (\omega_p/q_p)\ s + \omega_p^2]. \quad (3c)$$

The conductance terms, for example, $G_2$, of Eq. (3*a*) correspond to the reciprocal of the resistive value of the corresponding subscripted resistors used in the circuit, and the terms, $\alpha$, relate to the voltage divider ratios of networks 22, 23, and 24 as indicated in FIG. 4. The various $\alpha$ parameters may be used to create different filter functions. For example, an all-pass biquadratic transfer response is obtained by setting $$(\alpha_2/\alpha_3) = (2G_2/g_2), \quad (4)$$

and $$(\alpha_1/\alpha_3) = R_3g_3. \quad (5)$$

A low-pass or high-pass notch filter may be realized by setting:

$$(\alpha_2/\alpha_3) = (G_2/g_2), \quad (6)$$

and $$(\alpha_1/\alpha_3) = R_3g_3\ (\omega_Z/\omega_p)^2. \quad (7)$$

The parameter $\alpha_3$ may be used to set the d.c. or high frequency gain of the respective low-pass or high-pass network.

Figure 5:
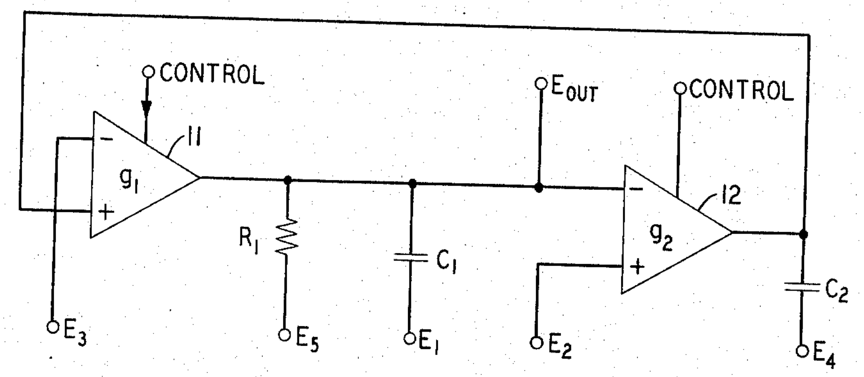
FIG. 5 is a filter circuit, in accordance with this invention, which is a modification of the filter circuit of FIG. 3 and which is responsive to a plurality of applied input signals.

The circuit of FIG. 5 substantially duplicates the elements of the circuit of FIG. 3; however, as depicted, at least five different input signals may be supplied to the circuit, i.e., $E_1$, $E_2$, $E_3$, $E_4$, and $E_5$. Current sources may also be used to supply signals to the various input terminals of the amplifiers. As an illustrative example, terminal $E_5$ may be grounded; then the transfer response for the network of FIG. 5, as a function, of four applied input voltages, is $$E_{OUT} = (C_1C_2s^2E_1 + g_1C_2s(E_4 - E_3) + g_1g_2E_2/C_1C_2s^2 + C_2G_1s + g_1g_2). \quad (8)$$

Figure 6:
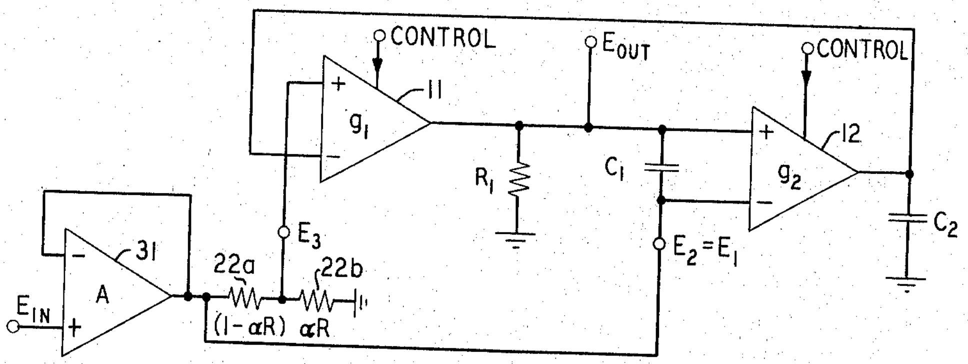
FIG. 6 is an illustrative modification of the filter circuit of FIG. 5.

As is apparent from Eq. (8), many different transfer responses may be obtained by altering the applied input signals and also by varying the amplifier transconductances as previously discussed. An illustrative circuit which realizes a 360° all-pass transfer response is depicted in FIG. 6. In this configuration the following conditions are satisfied:

$$E_1 = E_2 = E_{IN}; \quad (9)$$

$$E_5 = E_4 = 0 \text{ ; and} \quad (10)$$

$$E_3 = (G_1/g_1)E_{IN}. \quad (11)$$

The factor relating the parameters of Eq. (11) is provided by voltage divider 22 in a manner similar to that previously described. Operational amplifier 31 serves solely as a buffer amplifier for applying the input signal to the various terminals of the filter network. If so desired, an operational amplifier might also be used as a gain element or separate amplifiers may be used to provide independent values of any of signals $E_1$, $E_2$, $E_3$, $E_4$, and $E_5$ while maintaining a high input impedance through a noninverting configuration.

Figure 7:
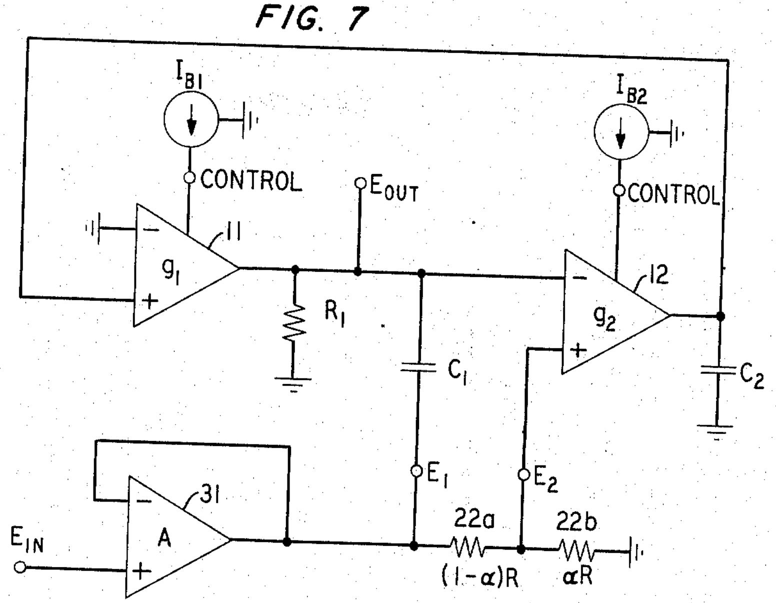
FIG. 7 is another illustrative modification of the circuit of FIG. 5, in accordance with the principles of this invention.

Another exemplary application of the circuit of FIG. 5 is illustrated in FIG. 7. The filter circuit of FIG. 7 exhibits a high-pass notch filter transfer response. As indicated, voltages $E_3$, $E_4$, and $E_5$ are equal to zero and the ratio of voltages $E_1$ and $E_2$ is altered by varying voltage divider network 22. Variable control current sources $I_{B1}$ and $I_{B2}$ permit the sweeping of the filter center frequency, by changing the value of the bias current, while maintaining bias current equality, i.e., $I_{B1} = I_{B2}$. Thus, the pole bandwidth and the ratio of the zero (transfer function numerator) natural frequency to the pole (transfer function denominator) natural frequency are maintained constant.

All of the circuits discussed so far have had fixed uncontrollable bandwidths. A circuit with a variable bandwidth may be obtained by the practice of this invention, by using the controlled lossy integrator circuit of FIG. 8 to replace the amplifier-resistor-capacitor combinations of the previously discussed circuits. One of the advantages of this circuit is its extreme simplicity. The transfer response of the lossy integrator of FIG. 8 is given by $$T(s) = (E_o/E_{IN}) = (g/g + Cs). \quad (12)$$

Figure 8:
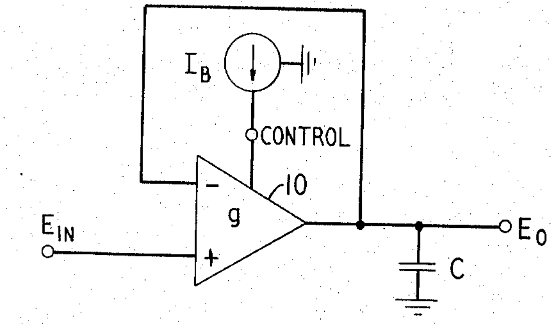
FIG. 8 is a circuit diagram of a lossy integrating circuit which uses a variable transconductance amplifier.
Figure 9:
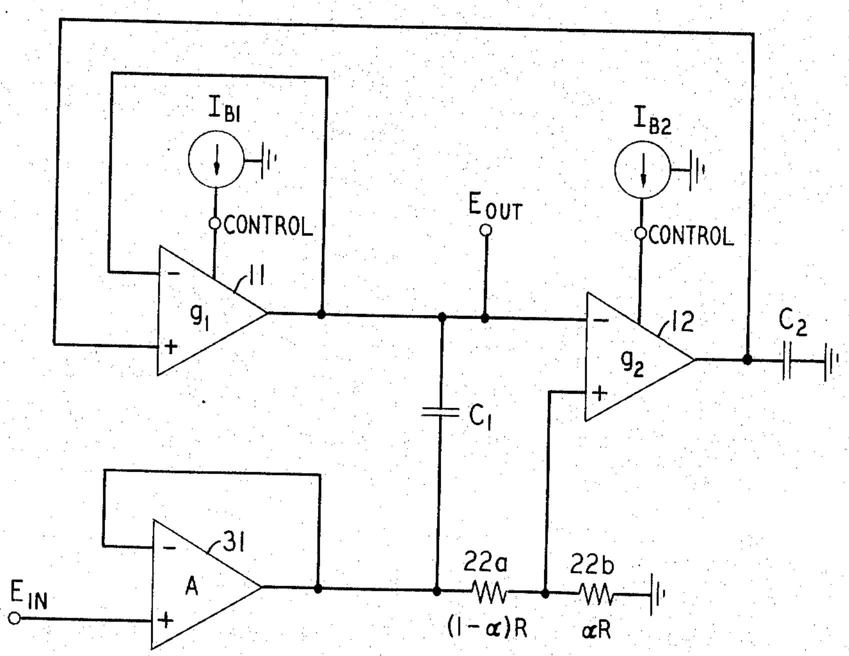
FIG. 9 is a filter circuit, in accordance with the principles of this invention, which utilizes the integrating circuit of FIG. 8.

The circuit of FIG. 9, for example, is substantially similar to the circuit of FIG. 7 with the exception that resistor $R_1$ has been eliminated and the lossy integrator circuit of FIG. 8 utilized. The transfer response of the circuit of FIG. 9 is given by $$T(s) = (C_1C_2s^2 + \alpha g_1g_2/C_1C_2s^2 + g_1C_2s + g_1g_2). \quad (13)$$

Thus, one may maintain the ratio of the zero natural frequency to the pole natural frequency constant while controlling the pole quality factor $q_p$ and resonant frequency with current sources $I_{B1}$ and $I_{B2}$. For example, by maintaining $I_{B2}$ equal to $q_p^2 \times I_{B1}$, one can frequency scale the whole filter without changing the transfer response shape.

What is claimed is:

1. An active filter circuit comprising:

first and second variable transconductance amplifiers having transconductance values $g_1$ and $g_2$, gain control terminals, and a first and second input terminal, respectively;

a first resistor having a resistive value $R_1$ jointly connected to an output terminal of said first amplifier and said first input terminal of said second amplifier, and to a terminal of fixed potential; a first capacitor having a capacitive value $C_1$ connected to said first input terminal of said second amplifier and to said terminal of fixed potential and to said second input terminal of said second amplifier;

a second capacitor having a capacitive value $C_2$ jointly connected to said second input terminal of said first amplifier and an output terminal of said second amplifier, and to said terminal of fixed potential;

a signal source connected to said first input terminal of said first amplifier;

said output terminal of said first variable transconductance amplifier providing a filter transfer response of $$(g_1s/C_1/s^2 + s/R_1C_1 + g_1g_2/C_1C_2)$$

where $s$ is the complex frequency variable;

said output of said second variable transconductance amplifier providing a filter transfer response of $$(g_1g_2/C_1C_2/s^2 + s/R_1C_1 + g_1g_2/C_1C_2)$$

where $s$ is the complex frequency variable; and means connected to said gain control terminals responsive to applied control signals for controlling and maintaining the transconductance of said amplifiers, $g_1$ and $g_2$, at a level such that the magnitude of the term $g_1g_2/C_1C_2$ is commensurate with the magnitude of the other terms in the denominators of said transfer responses, thereby insuring that said transfer responses are directly controlled by the values of $g_1$ and $g_2$.

2. An active filter circuit comprising:

first, second, and third variable transconductance amplifiers having transconductance coefficients $g_1$, $g_2$, and $g_3$, respectively, each having first and second input terminals, a control terminal and an output terminal;

a first capacitor having a capacitive value $C_1$ jointly connected to said first amplifier output terminal and said second amplifier first input terminal, and to a terminal of fixed potential;

a first resistor having a resistive value $R_2$ jointly connected to said second amplifier output terminal and said third amplifier first input terminal, and to said terminal of fixed potential;

a second capacitor having a capacitive value $C_2$ connected to said second amplifier output terminal and to said terminal of fixed potential;

a second resistor having a resistive value $R_3$ jointly connected to said third amplifier output terminal and said first amplifier first input terminal, and to said terminal of fixed potential;

a resistive network coupling an input signal of magnitude $\alpha_1E_{in}$, $\alpha_2E_{in}$, and $\alpha_3E_{in}$ to said second input terminals of said first, second, and third amplifiers, respectively;

said output terminal of said third variable transconductance amplifier providing a filter transfer response of $$\frac{\alpha_3 g_3 R_3\left[s^2+s\left(\frac{1}{C_2R_2}-\frac{g_2\alpha_2}{C_2\alpha_3}\right)+\frac{g_1g_2\alpha_1}{C_1C_2\alpha_3}\right]}{s^2+s\frac{1}{C_2R_2}+\frac{R_3g_1g_2g_3}{C_1C_2}}$$

where $s$ is the complex frequency variable; and means for applying control signals to said amplifier control terminals for selectively altering the transconductance of said first, second, and third amplifiers to control and maintain the magnitude of the terms $R_3g_3\,g_1g_2/C_1C_2$ and $g_1g_2\alpha_1/C_1C_2\alpha_3$ commensurate with the magnitude of the other terms in the denominator and the numerator of said response, respectively, thereby insuring that the poles and zeros of said transfer response are directly controlled by the values of $g_1$, $g_2$, and $g_3$.

3. An active filter circuit comprising:

first and second variable transconductance amplifiers having transconductance values $g_1$ and $g_2$, respectively, each amplifier having first and second input terminals, a control terminal and an output terminal;

a first resistor having resistive value $R_1$ jointly connected to said output terminal of said first amplifier and said first input terminal of said second amplifier, and to a first signal terminal, $E_5$; a first capacitor having a capacitive value $C_1$ connected to said first amplifier output terminal and to a second signal terminal, $E_1$;

a second capacitor having a capacitive value $C_2$ jointly connected to an output terminal of said second amplifier and said second input terminal of said first amplifier, and to a third signal terminal, $E_4$; a fourth signal terminal, $E_2$, connected to said second input terminal of said second amplifier;

a fifth signal terminal, $E_3$, connected to said first input terminal of said first amplifier;

said output of said first variable transconductance amplifier providing a filter transfer response of $$s^2E_1 + s\,[g_1(E_4 - E_3)/C_1 + E_5/C_1R_1] + g_1g_2E_2/C_1C_2\ s^2 + s/C_1R_1 + g_1g_2/C_1C_2$$

where $s$ is the complex frequency variable; and means connected to said control terminals of said amplifiers for selectively altering the transconductance of said first and second amplifiers to control and maintain the magnitude of the term $g_1g_2/C_1C_2$ commensurate with the magnitude of the other terms in the denominator of said filter transfer response, thereby insuring that the frequency of the poles of said transfer response is directly controlled by the values of $g_1$ and $g_2$ without interaction of any resistive components.

4. The active filter circuit as defined in claim 3 further comprising:

means for connecting said first and third signal terminals to a terminal of fixed potential;

a resistive network for applying an input signal to said first input terminal of said first amplifier;

and means for applying said input signal jointly to said second signal terminal and to said second input terminal of said second amplifier.

5. The active filter circuit as defined in claim 3 further comprising:

means for connecting said first and third signal terminals and said first input terminal of said first amplifier to a terminal of fixed potential;

and a resistive network for selectively applying an input signal to said second signal terminal and to said second input terminal of said second amplifier.

6. An active filter circuit comprising:

an input signal source;

first and second variable transconductance amplifiers having variable transconductance $g_1$ and $g_2$, respectively, each amplifier having first and second input terminals, a control terminal, and an output terminal, said first amplifier first input terminal connected to said first amplifier output terminal;

a first capacitor having a capacitive value $C_1$ jointly connected to said first amplifier output terminal and said second amplifier first input terminal, and to said signal source;

a second capacitor having a capacitive value $C_2$ jointly connected to said second amplifier output terminal and said first amplifier second input terminal, and to a terminal of fixed potential; a resistive network connected to said second amplifier second input terminal and to said signal source providing a fraction, $\alpha$, of said signal source's signal magnitude to said second input terminal of said second amplifier;

said output terminal of said first variable transconductance amplifier providing a filter transfer response of $$(s^2 + \alpha g_1g_2/C_1C_2/s^2 + sg_1/C_1 + g_1g_2/C_1C_2)$$

where $s$ is the complex frequency variable; and means for applying control signals to said amplifier control terminals for selectively varying the transconductance of said amplifier to maintain the magnitude of $g_1g_2/C_1C_2$ commensurate with the other terms in the denominator of said transfer response, thereby insuring that the frequency of the poles of said transfer response is substantially controlled by the values of $g_1$ and $g_2$.

* * * * *